(12) United States Patent
Wiland et al.

(10) Patent No.: US 12,358,345 B2
(45) Date of Patent: Jul. 15, 2025

(54) TWO-PHASE COOLING SYSTEM FOR ELECTRIC VEHICLES

(71) Applicant: FCA US LLC, Auburn Hills, MI (US)

(72) Inventors: Michael J Wiland, Washington Township, MI (US); Matthew T Bartlett, Northville, MI (US); Daniel E Hornback, Davisburg, MI (US)

(73) Assignee: FCA US LLC, Auburn Hills, MI (US)

( * ) Notice: Subject to any disclaimer, the term of this patent is extended or adjusted under 35 U.S.C. 154(b) by 301 days.

(21) Appl. No.: 18/187,140

(22) Filed: Mar. 21, 2023

(65) Prior Publication Data

US 2024/0317022 A1    Sep. 26, 2024

(51) Int. Cl.
| | | |
|---|---|---|
| *B60H 1/00* | (2006.01) | |
| *B60K 1/00* | (2006.01) | |
| *B60K 1/04* | (2019.01) | |
| *B60K 11/02* | (2006.01) | |
| *H05K 7/20* | (2006.01) | |

(52) U.S. Cl.
CPC ..... *B60H 1/00914* (2013.01); *B60H 1/00278* (2013.01); *B60K 1/04* (2013.01); *B60K 11/02* (2013.01); *H05K 7/20327* (2013.01); *H05K 7/20354* (2013.01); *H05K 7/20881* (2013.01); *H05K 7/20936* (2013.01); *B60H 2001/00307* (2013.01); *B60H 2001/00928* (2013.01); *B60H 2001/00949* (2013.01); *B60K 2001/005* (2013.01); *B60K 2001/006* (2013.01)

(58) Field of Classification Search
CPC ............ B60H 1/00914; B60H 1/00278; B60H 2001/00307; B60H 2001/00928; B60H 2001/00949; B60H 1/143; B60H 1/00885; B60K 1/04; B60K 11/02; B60K 2001/005; B60K 2001/006; H05K 7/20327; H05K 7/20354; H05K 7/20881; H05K 7/20936

See application file for complete search history.

(56) References Cited

U.S. PATENT DOCUMENTS

| | | | | |
|---|---|---|---|---|
| 4,800,737 | A * | 1/1989 | Smith | F25B 41/22 62/503 |
| 5,193,351 | A * | 3/1993 | Laukhuf | F25B 45/00 62/505 |
| 11,112,155 | B1 * | 9/2021 | Vaisman | F25B 5/04 |
| 11,561,030 | B1 * | 1/2023 | Vaisman | F25B 1/00 |
| 11,561,033 | B1 * | 1/2023 | Vaisman | F25B 19/005 |
| 11,629,890 | B1 * | 4/2023 | Vaisman | F25B 5/02 62/199 |
| 11,629,892 | B1 * | 4/2023 | Vaisman | F25B 25/02 62/79 |

(Continued)

FOREIGN PATENT DOCUMENTS

| | | | | |
|---|---|---|---|---|
| CA | 3039974 | A1 * | 10/2019 | ........... B23Q 11/141 |
| KR | 2020-0096866 | A | 8/2020 | |
| KR | 20210059432 | A * | 5/2021 | |

*Primary Examiner* — Kun Kai Ma
(74) *Attorney, Agent, or Firm* — Jeremy J. Klobucar

(57) ABSTRACT

A cooling system for an electric vehicle that includes a cooling system loop including a refrigerant, a compressor, and a heat exchanger. The cooling system loop includes a plurality of sub-loops configured to receive the refrigerant after the refrigerant exits the heat exchanger, wherein the sub-loops include a component to be cooled by the refrigerant.

16 Claims, 5 Drawing Sheets

(56) References Cited

U.S. PATENT DOCUMENTS

| | | | |
|---|---|---|---|
| 11,629,901 B1* | 4/2023 | Vaisman | F25B 43/00 |
| | | | 62/115 |
| 11,644,221 B1* | 5/2023 | Vaisman | B60H 1/00899 |
| | | | 62/115 |
| 11,732,941 B1* | 8/2023 | Vaisman | F25B 41/24 |
| | | | 62/117 |
| 2019/0226723 A1* | 7/2019 | Heyl | F25B 49/02 |
| 2022/0151102 A1* | 5/2022 | Snyder | H05K 7/20354 |

* cited by examiner

TWO-PHASE COOLING SYSTEM FOR ELECTRIC VEHICLES

FIELD

The present disclosure relates to a two-phase cooling system for an electric vehicle.

BACKGROUND

Vehicles with electric propulsion systems are becoming increasingly more common. Some electrically propelled vehicles include an electric drive motor at each wheel of the vehicle, and some electrically propelled vehicles include a front electric drive motor for rotating the front wheels of the vehicle and a rear electric drive motor for rotating the rear wheels of the vehicle. In either case, the electric drive motors may include a power inverter device that is configured to convert DC power supplied by a battery of the vehicle to AC power for use by the electric drive motor to provide a motive force for the wheels.

The electric drive motors, power inverter devices, and battery generate heat during use thereof. As a result, the electric drive motors, power inverter devices, and battery may require cooling during use thereof. Methods of cooling the electric drive motors and power inverter devices currently include using a cooling system having a dedicated heat exchanger that circulates a coolant that may be composed of a mixture of ethylene glycol and water through or around the electric drive motor (to cool a lubricant contained in the electric drive motor) and power inverter device. Methods of cooling the battery currently may include using a thermal gel that draws heat from cells of the battery to a cooling plate attached to or located proximate the battery, where the heat is then removed via forced convection using a coolant that may be similar to that used to cool the electric drive motor and power inverter device (e.g., a mixture of ethylene glycol and water). These systems require a chiller to remove heat from the coolant before it enters the electric drive motor, power inverter device, and battery. These methods of cooling these components, however, have relatively low controllability and, therefore, are slow reacting systems that do not permit increased or decreased cooling to be achieved as dynamically as may be required as the sophistication of these components increases.

SUMMARY

According to a first aspect of the present disclosure there is provided a cooling system for an electric vehicle. The cooling system includes a cooling system loop including a refrigerant, a compressor, and a heat exchanger, the cooling system loop including a plurality of sub-loops configured to receive the refrigerant after the refrigerant exits the heat exchanger. At least one of the plurality of sub-loops includes a mass flow metering device configured to receive the refrigerant in a liquid phase from the heat exchanger; a separator configured to receive the refrigerant in the liquid phase after passing through the mass flow metering device; a pump configured to draw the refrigerant in the liquid phase from the separator; and a component located downstream from the pump that is configured to be cooled by the refrigerant in the liquid phase. After exchanging heat with the component to be cooled, the refrigerant in the liquid phase at least partially undergoes a phase change to gas and a mixture of the refrigerant in each of the gas and liquid phases is returned to the separator, and the separator includes a pressure regulation valve configured to release the refrigerant in the gas phase from the separator to travel back to a suction line of the compressor, wherein an amount of refrigerant that is permitted to travel to the at least one sub-loop from the heat exchanger is based on an amount of the refrigerant in the gas phase that is released from the separator.

According to the first aspect, the refrigerant in the liquid phase collected in the separator is provided back to the pump.

According to the first aspect, the mass flow metering device is configured to control an amount of refrigerant in the liquid phase that enters the at least one sub-loop.

According to the first aspect, the cooling system may further include a controller in communication with at least the mass flow metering device and pressure regulation valve, wherein the controller is configured to operate each of the mass flow metering device and pressure regulator valve to control an amount of the refrigerant in the gas phase that exits the separator and an amount of refrigerant in the liquid phase that passes through the mass flow metering device to control the amount of refrigerant that travels to the at least one sub-loop from the heat exchanger.

According to the first aspect, the separator includes a plurality of sensors, a first sensor of the plurality of sensors is configured to generate a signal indicative of an amount of the refrigerant in the liquid phase contained in the reservoir, a second sensor is configured to generate a signal indicative of at least one of a temperature and pressure of the refrigerant contained in the reservoir, and based on the signals generated by the first sensor and the second sensor, the controller is configured to control the amount of the refrigerant in the gas phase that exits the separator and the amount of refrigerant that passes through the mass flow metering device in the liquid phase to control the amount of refrigerant that travels to the at least one sub-loop from the heat exchanger.

According to the first aspect, the controller is configured to control the pressure regulator valve such that the refrigerant in the gas phase that exits the separator is at a pressure that matches a suction pressure of the suction line of the compressor.

According to the first aspect, the component to be cooled is either a drive assembly of the electric vehicle that includes at least one of an electric drive motor and a power inverter device or a battery of the electric vehicle.

According to the first aspect, the cooling system may further include a second sub-loop and a third loop that are each configured to receive the refrigerant after the refrigerant exits the heat exchanger.

According to the first aspect, the second sub-loop includes a second mass flow metering device configured to receive the refrigerant in a liquid phase from the heat exchanger; a second separator configured to receive the refrigerant in the liquid phase after passing through the second mass flow metering device; a second pump configured to draw the refrigerant in the liquid phase from the second separator; and a second component located downstream from the second pump that is configured to be cooled by the refrigerant in the liquid phase; wherein after exchanging heat with the second component to be cooled, the refrigerant in the liquid phase at least partially undergoes a phase change to gas and a mixture of the refrigerant in each of the gas and liquid phases is returned to the second separator, and the second separator includes a second pressure regulation valve configured to release the refrigerant in the gas phase from the second separator to travel back to a suction line of the compressor, and wherein an amount of refrigerant that is permitted to travel to second sub-loop from the heat exchanger is based on an amount of the refrigerant in the gas phase that is released from the second separator.

According to the first aspect, the third sub-loop includes a third mass flow metering device configured to receive the refrigerant in a liquid phase from the heat exchanger; a third separator configured to receive the refrigerant in the liquid phase after passing through the third mass flow metering device; a third pump configured to draw the refrigerant in the liquid phase from the third separator; and a third component located downstream from the third pump that is configured to be cooled by the refrigerant in the liquid phase, wherein after exchanging heat with the third component to be cooled, the refrigerant in the liquid phase at least partially undergoes a phase change to gas and a mixture of the refrigerant in each of the gas and liquid phases is returned to the third separator, and the third separator includes a third pressure regulation valve configured to release the refrigerant in the gas phase from the third separator to travel back to a suction line of the compressor, and wherein an amount of refrigerant that is permitted to travel to the third sub-loop from the heat exchanger is based on an amount of the refrigerant in the gas phase that is released from the third separator.

According to the first aspect, the second component to be cooled is a drive assembly of the electric vehicle that includes at least one of an electric drive motor and a power inverter device, and the third component to be cooled is a battery of the electric vehicle.

According to a second aspect of the present disclosure, there is provided an electric vehicle including a vehicle body that defines a cabin; a drive assembly including an electric drive motor and a power inverter device; a battery for providing a current to the power inverter device that converts the current to one that can actuate the electric drive motor; and a cooling system loop including a refrigerant, a compressor, and a heat exchanger, the cooling system loop including a plurality of sub-loops configured to receive the refrigerant after the refrigerant exits the heat exchanger. A first sub-loop of the plurality of sub-loops includes a cabin heat exchanger in communication with each of the heat exchanger and compressor, the first sub-loop being configured to cool the cabin of the electric vehicle. A second sub-loop of the plurality of sub-loops includes a first mass flow metering device configured to receive the refrigerant from the heat exchanger; a first separator configured to receive the refrigerant from the first mass flow metering device; a first pump configured to draw the refrigerant from first separator; and the drive assembly, which is located downstream from the pump and configured to be cooled by the refrigerant. After exchanging heat with the drive assembly, the refrigerant at least partially undergoes a phase change to gas and a mixture of the refrigerant in each of the gas and liquid phases is returned to the first separator, and the first separator includes a first pressure regulation valve configured to release the refrigerant in the gas phase from the first separator to travel back to a suction line of the compressor. A third sub-loop of the plurality of sub-loops includes a second mass flow metering device configured to receive the refrigerant from the heat exchanger; a second separator configured to receive the refrigerant from the second mass flow metering device; a second pump configured to draw the refrigerant from second separator; and the battery, which is located downstream from the second pump and configured to be cooled by the refrigerant. After exchanging heat with the battery, the refrigerant at least partially undergoes a phase change to gas and a mixture of the refrigerant in each of the gas and liquid phases is returned to the second separator, and the second separator includes a second pressure regulation valve configured to release the refrigerant in the gas phase from the second separator to travel back to a suction line of the compressor, wherein an amount of refrigerant that is permitted to travel to the at least the second sub-loop and the third sub-loop from the heat exchanger is based on an amount of the refrigerant in the gas phase that is released from the first and second separators.

According to the second aspect, the first and second mass flow metering devices are each configured to control an amount of refrigerant that enters the second sub-loop and the third sub-loop, respectively.

According to the second aspect, the vehicle may further include a controller in communication with at least the first and second mass flow metering devices and the first and second pressure regulation valves, wherein the controller is configured to operate each of the first and second mass flow metering devices and first and second pressure regulator valves to control an amount of the refrigerant in the gas phase that exits the first and second separators and an amount of refrigerant that passes through the first and second mass flow metering devices to control the amount of refrigerant that travels to the second sub-loop and the third sub-loop, respectively, from the heat exchanger.

According to the second aspect, each of the first and second separators include a plurality of sensors, a first sensor of the plurality of sensors is configured to generate a signal indicative of an amount of the refrigerant in the liquid phase contained in the respective first and second separators, a second sensor is configured to generate a signal indicative of at least one of a temperature and pressure of the refrigerant contained in the respective first and second separators, and based on the signals generated by the first sensor and the second sensor, the controller is configured to control the amount of the refrigerant in the gas phase that exits the respective separator and the amount of refrigerant that passes through the respective mass flow metering device to control the amount of refrigerant that travels to the respective second sub-loop and third sub-loop from the heat exchanger.

According to the second aspect, the controller is configured to control the first and second pressure regulator valves such that the refrigerant in the gas phase that exits the first and second separators is at a pressure that matches a suction pressure of the suction line of the compressor.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DETAILED DESCRIPTION

Figure 1:
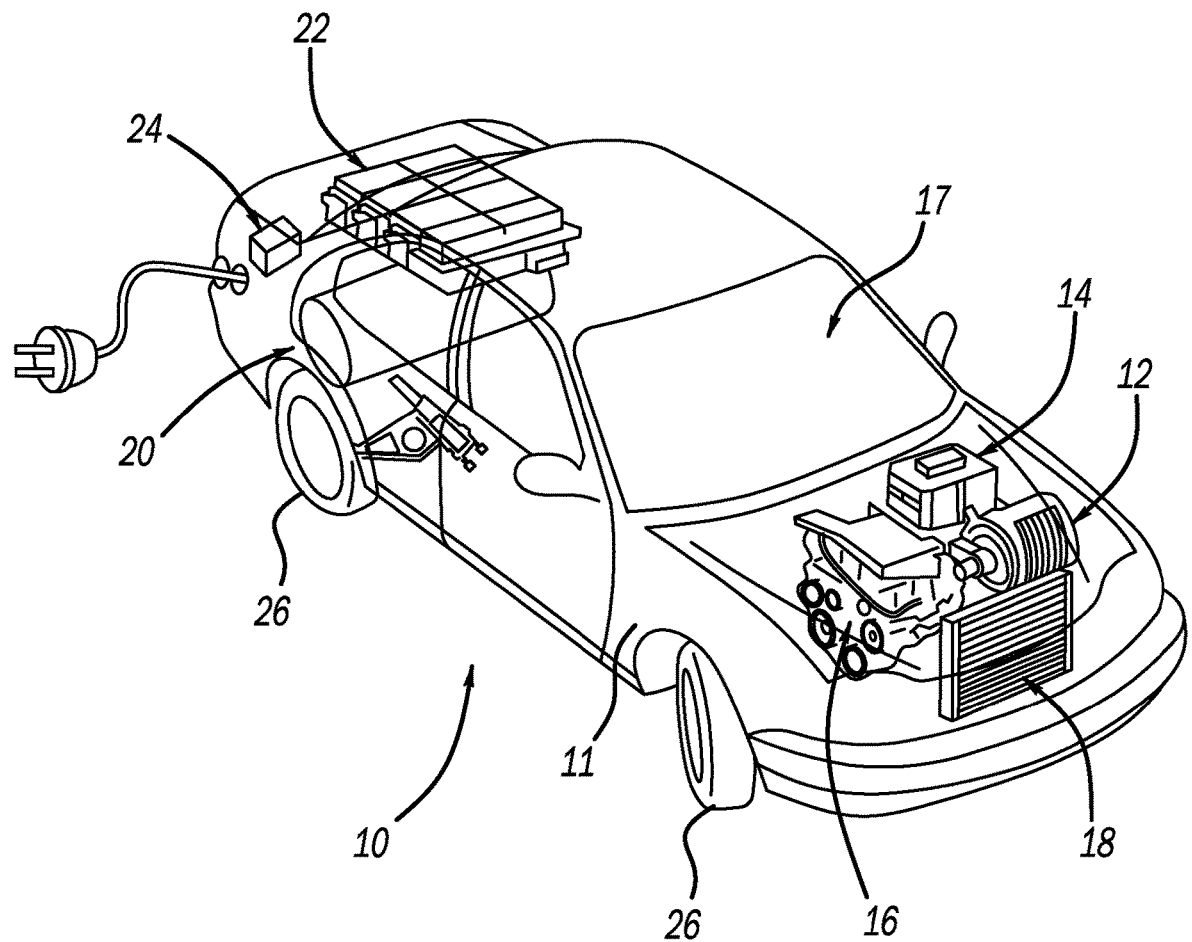
FIG. 1 illustrates a vehicle according to a principle of the present disclosure.

Example embodiments will now be described more fully with reference to the accompanying drawings. The example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

FIG. 1 illustrates a vehicle 10 according to a principle of the present disclosure. The vehicle 10 in the illustrated embodiment is a hybrid vehicle including a vehicle body 11 that defines a cabin 17, an electric motor 12 and associated power electronics 14, an internal combustion engine 16, a heat exchanger 18 (hereinafter, radiator), a fuel source 20, a battery 22, a charger 24, and a plurality of wheels 26. If vehicle 10 is an electric vehicle rather than a hybrid vehicle, engine 16 and fuel source 20 may be omitted. As will be described in more detail below, heat exchanger is part of a cooling system 28 (FIG. 2) that can be used to cool electric motor 12, power electronics 14, and battery 24.

Figure 2:
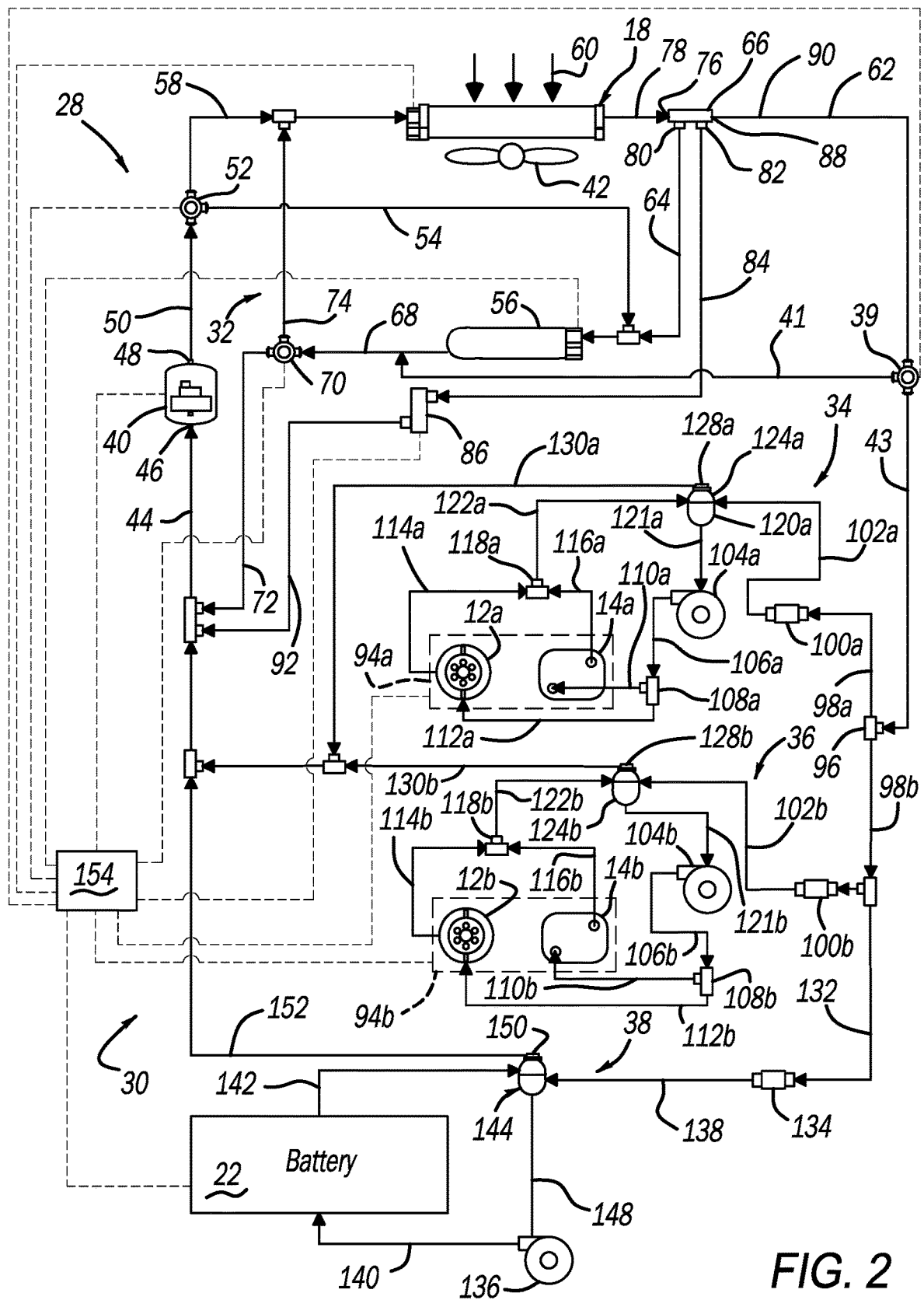
FIG. 2 is a schematic representation of a cooling system and cooling loop that may be used to cool an electric drive motor, power inverter device, and battery of the electric vehicle illustrated in FIG. 1.

Before proceeding with description of cooling system 28, it should be understood that while only a single electric motor 12 is illustrated in FIG. 1, one skilled in the art will readily acknowledge and appreciate that vehicle 10 may be provided with a plurality of electric motors 12 and associated power electronics 14. For example, the vehicle 10 may include a pair of electric motors 12 (e.g., as shown in FIG. 2) that each include an associated electronics device 14, with one of the electric motors 12 being configured to rotate the wheels 26 located a front of the vehicle 10 and the other electric motor 12 being configured to rotate the wheels 26 located at a rear of the vehicle 10. Alternatively, vehicle 10 may include four electric motors 12 that each include an associated electronics device 14 with each wheel 26 having a dedicated motor 12 for rotation thereof.

Now referring to FIG. 2, cooling system 28 includes a coolant or refrigerant loop 30 that includes a plurality of coolant or refrigerant sub-loops 32, 34, 36, and 38. Components of coolant loop 30 that are utilized by each of the coolant sub-loops 32, 34, 36, and 38 include a compressor 40, radiator 18 located at a front of vehicle 10, and an air moving device 42 such as a fan, which is configured to draw ambient air through radiator 18 so that heat transfer can occur between a refrigerant carried by coolant loop 30 and the ambient air. Compressor 40 and refrigerant can be any type of compressor or refrigerant known to one skilled in the art.

Sub-loop 32 generally is directed to cooling and/or heating an interior (e.g., cabin 17) of vehicle 10. Sub-loop 32 is configured to operate in at least two modes including a cooling mode where the interior of the vehicle 10 is cooled and a heating mode where the interior of the vehicle 10 is heated. In this regard, sub-loop 32 can operate as an air conditioner or a heat pump. In the illustrated embodiment of sub-loop 32, the coolant that circulates through coolant system 28 travels through a suction line 44 to a suction inlet 46 of compressor 40, which then compresses the refrigerant and discharges the compressed refrigerant through a discharge outlet 48 to a discharge line 50. Discharge line 50 is connected to a first switching valve 52 that permits the compressed refrigerant to travel either to radiator 18 located at the front of vehicle 10 (i.e., in the cooling mode) or to a first cabin heat exchanger inlet line 54 that is connected to a cabin heat exchanger 56 that is located within the interior of vehicle 10 (i.e., in the heating mode).

While in the cooling mode, the compressed refrigerant passes through first switching valve 52 and enters a radiator inlet line 58 before entering radiator 18, which in the cooling mode is configured to operate as a condenser. After the refrigerant is condensed in radiator 18 and exchanges heat with the ambient air 60 drawn through radiator 18 by fan 42, the refrigerant exits radiator 18 and enters a radiator outlet line 62. As the refrigerant travels through radiator outlet line 62, a portion of the refrigerant can be directed to a second cabin heat exchanger inlet line 64 that communicates with cabin heat exchanger 56 by a double-tee joint 66. As the refrigerant enters cabin heat exchanger 56, which is configured to function as an evaporator when sub-loop 32 is in the cooling mode, the refrigerant will undergo phase change from a liquid to a gas. After this phase change, the gaseous refrigerant enters a cabin heat exchanger outlet line 68 before reaching a second switching valve 70 that communicates with an outlet line 72 that is connected to suction line 44 of compressor 40. Second switching valve 70 also communicates with a bypass line 74 that is connected to radiator inlet line 58 such that after the refrigerant exits cabin heat exchanger 56, the gaseous refrigerant can bypass compressor 40 and travel back to radiator 18. Operation of second switching valve 70 controls whether the gaseous refrigerant returns to compressor 40 or radiator 18.

Double-tee joint 66 includes an inlet 76 that communicates with a first portion 78 of radiator outlet line 62 located immediate downstream from radiator 18, a first outlet 80 that communicates with second cabin heat exchanger inlet line 64, a second outlet 82 that communicates with shut-off valve inlet line 84 that communicates with a shut-off valve 86, and a third outlet 88 that communicates with a second portion 90 of radiator outlet line 62. When first sub-loop 32 is in the cooling mode, shut-off valve 86 is closed and prevents refrigerant carried by shut-off valve inlet line 84 from reaching a shut-off valve outlet line 92 that communicates with suction line 44 of compressor 40.

When sub-loop 32 is operating in a heating mode, refrigerant compressed by compressor 40 enters discharge line 50, is then routed by first switching valve 52 to first cabin heat exchanger inlet line 54, and then travels to cabin heat exchanger 56, which in the heating mode operates as a condenser. The condensed refrigerant then exits cabin heat exchanger 56 through cabin heat exchanger outlet line 68 to second switching valve 70, which directs the condensed refrigerant to bypass line 74. The condensed refrigerant travels through bypass line 74 to radiator inlet line 58 before entering radiator 18, which in the heating mode is configured to operate as an evaporator. After passing through radiator 18, the refrigerant will undergo phase change from liquid to gas and exit radiator 18 through radiator outlet line 62 to double-tee joint 66, where a portion of the gaseous refrigerant can be directed back to second cabin heat exchanger inlet line 64 to renter cabin heat exchanger 56, and another portion of the gaseous refrigerant can be directed to shut-off valve inlet line 84. Gaseous refrigerant in shut-off valve inlet line 84 is then permitted to pass through the shut-off valve 86, which is open in the heating mode, to shut-off valve outlet line 92 before reentering compressor 40 through suction line 44.

In either the cooling mode or the heating mode, a portion of the refrigerant that passes through radiator 18 is permitted to travel to second portion 90 of radiator outlet line 62. As shown in FIG. 2, the second portion 90 of radiator outlet line communicates the refrigerant of cooling system 28 to each of the sub-loops 34, 36, and 38 via a third switching valve 39. If refrigerant is not to be provided to sub-loops 34, 36, and 38, third switching valve 39 can communicate the refrigerant back to cabin heat exchanger outlet line 68 via a sub-loop bypass line 41. If cooling is desired in the sub-loops 34, 36, and 38, third switching valve 39 directs the refrigerant to the sub-loops 34, 36, and 38 via a sub-loop inlet line 43. Inasmuch as sub-loops 34 and 36 are either substantially similar or identical to each other, description of these sub-loops will be described before sub-loop 38.

Sub-loops 34 and 36 are designed to provide the refrigerant of cooling system 28 to a first drive assembly 94a and a second drive assembly 94b. Each drive assembly 94a, 94b includes an electric motor 12a and 12b, respectively, that have an associated power electronic module 14a and 14b, respectively, located proximate or attached thereto. Power electronic modules 14a and 14b may each be a power inverter device that is configured to convert DC power supplied by battery 22 of vehicle 10 to AC power for use by the electric drive motors 12a, 12b to provide a motive force to the wheels 26.

As noted above, sub-loops 34 and 36 are substantially similar to each other or identical. Accordingly, the below description of these sub-loops will predominantly be directed to sub-loop 34. Notwithstanding, to distinguish the features of sub-loop 34 from the features of sub-loop 36, the reference numbers associated with sub-loop 34 will include the letter "a" (e.g., drive assembly 94a) and the reference numbers associated with sub-loop 36 will include the letter "b" (e.g., drive assembly 94b).

Sub-loop inlet line 43 is attached to a tee-joint 96 that directs the refrigerant to each of sub-loop 34 and sub-loop 36. Specifically, tee-joint 96 directs the refrigerant to an inlet line 98a that is connected to a mass flow metering device 100a. Mass flow metering device 100a may be any type of mass flow metering device known to one skilled in the art. For example, mass flow metering device 100a may be a proportionally controlled valve that is actuated by using a solenoid, a stepper motor, or by rotating a worm gear. Mass flow metering device 100a can be used to control the amount of refrigerant that is permitted to reach drive assembly 94a, as will be described in more detail later.

After passing through mass flow metering device 100a, the refrigerant enters a mass flow metering device outlet line 102a that is connected to a separator 120a that is configured to store a portion of the refrigerant therein. Separator 120a is attached to a pump 104a via a first separator outlet line 121a. Pump 104a is configured to draw the refrigerant toward the sub-loop 34 from separator 120a. After exiting pump 104a, the refrigerant enters a drive assembly inlet line 106a that feeds the refrigerant to the drive assembly 94a. Drive assembly inlet line 106a is connected to a tee joint 108a that diverts the refrigerant to each of the electric drive motor 12a and power electronics module 14a.

Specifically, power electronics module 14a may be equipped with a jacket or heat sink 15a (FIG. 3) that receives refrigerant from a power electronics module inlet line 110a.

Similarly, electric drive motor 12a may be equipped with a jacket or heat sink 13a (FIG. 3) that receives refrigerant from an electric drive motor inlet line 112a. While heat sinks 13a, 15a are illustrated as being external to electric drive motor 12a and power electronics 14a, it should be understood that the heat sinks 13a, 15a may be located internally within these components with departing from the scope of the present disclosure. In either case, the heat generated by electric drive motor 12a and power electronics module 14a may then be transferred to the refrigerant, which exits each of the electric drive motor 12a and power electronics module 14a through an electric drive motor outlet line 114a and power electronics outlet line 116a, respectively.

Outlet lines 114a and 116a are connected at tee joint 118a that is connected to a separator (e.g., accumulator) 120a by a separator inlet line 122a. When the refrigerant absorbs heat from electric drive motor 12a and power electronics module 14a, a portion of the refrigerant can undergo phase change from liquid to gas. Separator 120a includes a reservoir 124a that is configured to collect the liquid refrigerant from separator inlet line 122a (and also received from first mass flow metering device 100a) and return the liquid refrigerant back to pump 104a through first separator outlet line 121a, where the liquid refrigerant can again be used to cool electric drive motor 12a and power electronics module 14a. Meanwhile, the gaseous refrigerant received by separator 120a from separator inlet line 122a may be released from separator 120a through a pressure regulation valve 128a located atop separator 120a. After exiting pressure regulation valve 128a, the gaseous refrigerant enters a second separator outlet line 130a that is connected to suction line 44 of compressor 40.

Now description of the sub-loop 38 that is used to cool battery 22 will be described. Sub-loop 38 includes an inlet line 132 connected to inlet line 98b of sub-loop 34, which is connected to radiator outlet line 62. Refrigerant from inlet line 132 is provided to another mass flow metering device 134 that is connected to another separator 144 by mass flow metering device outlet line 138, which provides the refrigerant to a pump 136 via a first battery separator outlet line 148. Pump 136 feeds the refrigerant to a battery coolant inlet line 140 that provides the coolant to either a heat sink or jacket 23 (FIG. 5) of battery 22 that is designed to draw heat generated by battery 22 to the refrigerant passing therethrough. After the refrigerant absorbs heat generated by battery 22, at least a portion of the refrigerant may undergo phase change to gas. The mixture of gaseous/liquid refrigerant exits the heat sink or jacket of battery 22 through battery coolant outlet line 142 that is connected to separator 144.

Separator 144 includes a reservoir 146 that is configured to collect the liquid refrigerant received from battery coolant outlet line 142 (and also from mass flow metering device 134) and return the liquid refrigerant back to pump 136 where the liquid refrigerant can again be used to cool battery 22. Meanwhile, the gaseous refrigerant contained within separator 144 may be released from separator 144 through a pressure regulation valve 150 located atop separator 144. After exiting pressure regulation valve 150, the gaseous refrigerant enters a second battery separator outlet line 152 that is connected to suction line 44 of compressor 40.

According to the above-described configuration of coolant system 28, the refrigerant that is typically used for controlling a temperature of a cabin of the vehicle 10 can also be used to simultaneously cool a drive assembly 94a, 94b of the vehicle 10 that includes an electric drive motor 12a, 12b and associated power electronics module 14a, 14b that includes a power inverter device. The refrigerant that is typically used for controlling the temperature of the cabin of the vehicle can also be used to cool a battery assembly 22 of the vehicle 10. Accordingly, a separate cooling system that requires a chiller to cool the drive assemblies 94a, 94b and/or battery 22 can be omitted.

Figure 3:
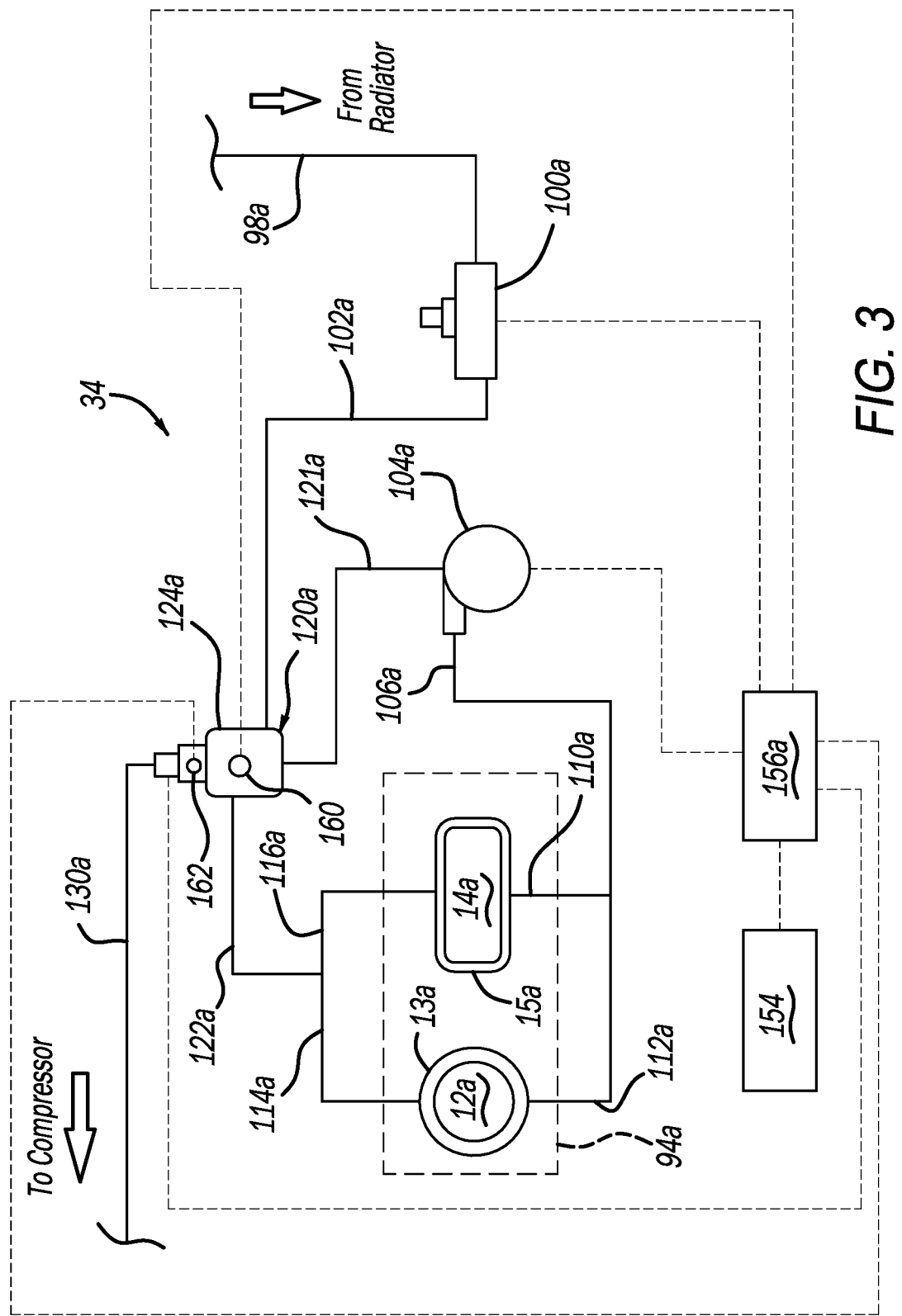
FIGS. 3 and 4 are schematic representations of sub-loops that are part of the cooling system and cooling loop illustrated in FIG. 1 useful for cooling electric drive motor assemblies and associated power electronic devices of the electric vehicle.
Figure 4:
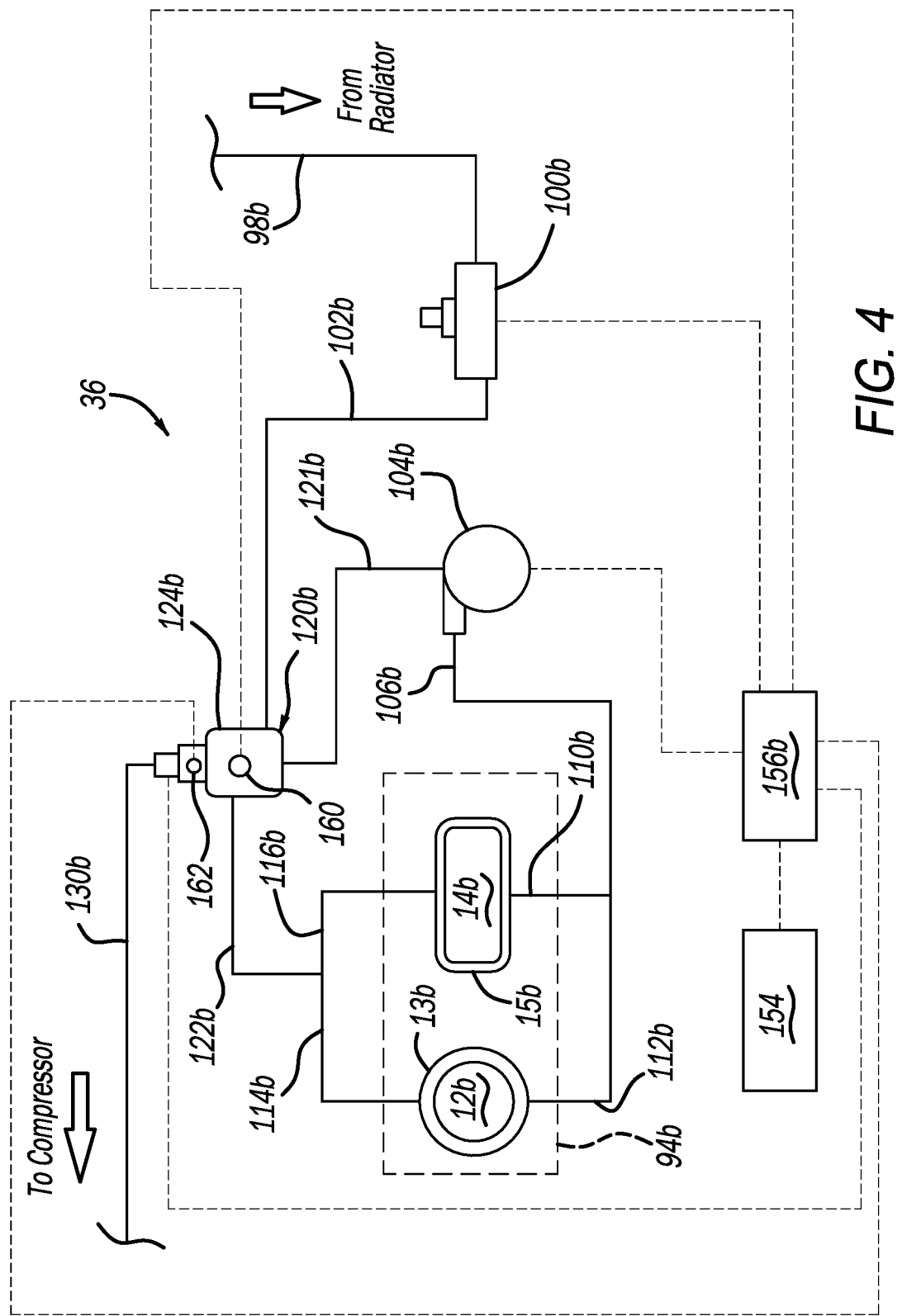
Figure 5:
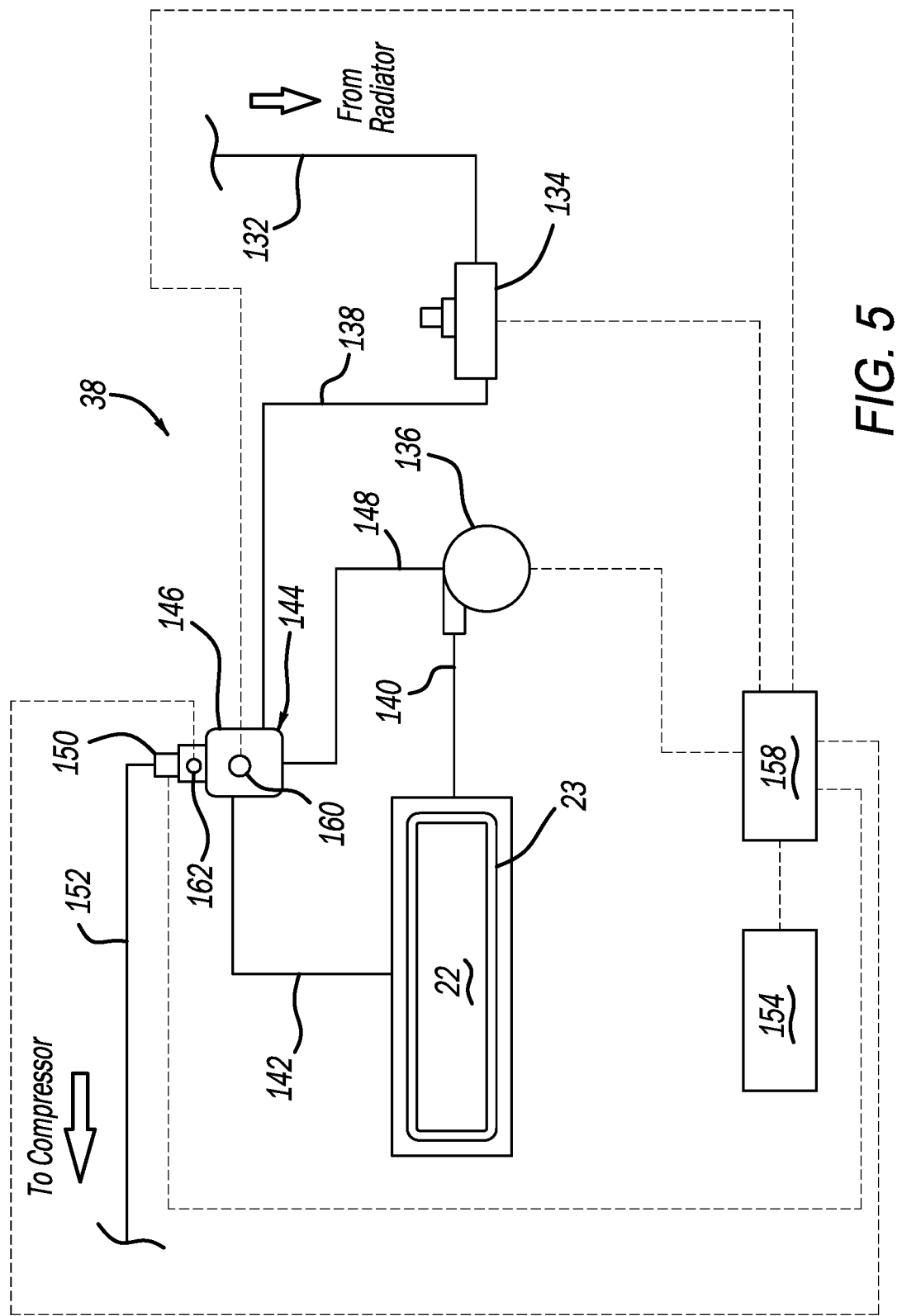
FIG. 5 is a schematic representation of a sub-system and sub-loop that is part of the cooling system and cooling loop illustrated in FIG. 1 useful for cooling a battery of the electric vehicle.

As shown in FIG. 2, cooling system 28 may include a controller 154 for controlling operation of various features of the cooling system 28 such as compressor 40, a valve (if any) of radiator 18, first switching valve 52, a valve (if any) of cabin heat exchanger 56, second switching valve 70, third switching valve 39, shut-off valve 86, drive assemblies 94a, 94b, and battery 22. Although not shown in FIG. 2, pumps 104a, 104b, and 136 may also be controlled by controller 154 (FIGS. 3, 4, and 5). Controller 154 may be an electronic control unit (ECU) of vehicle 10, or the controller 154 may be separate from the ECU. Although not illustrated, it should be understood that controller 154 may also be used to operate various features of sub-loops 34, 36, and 38. Alternatively, as shown in FIGS. 3 to 5, separate controllers 156a, 156b, and 158 may be used for each sub-loop 34, 36, and 38, respectively, that each communicate and work together with controller 154.

More specifically, referring to FIGS. 3 to 5, the separate controllers 156a, 156b, and 158 may communicate with mass flow metering devices 100a, 100b, and 134; pumps 104a, 104b, and 136; and pressure regulators 128a, 128b, and 150 of each of the sub-loops 34, 36, and 38, respectively. In addition, it should be understood that separators 120a, 120b, and 144 each include a liquid level sensor 160 and pressure/temperature sensor 162. While only a single sensor 162 is illustrated for monitoring pressure and temperature, it should be understood that separators 120a, 120b, and 144 may include an individual sensor for monitoring pressure and an individual sensor for monitoring temperature. That is, the single sensor 162 illustrated in FIGS. 3 to 5 for monitoring pressure/temperature is shown for simplicity of illustration.

The sub-loops 34, 36, and 38 are designed for cooling drive assemblies 94a, 94b and battery 22 using refrigerant in two phases-a liquid phase of the refrigerant and a gas phase of the refrigerant. As noted above, the refrigerant used to cool drive assemblies 94a, 94b and battery 22, as it exchanges heat with these devices, will undergo phase change from liquid to gas. Once the two-phase mixture of refrigerant reaches separators 120a, 120b, and 144, the liquid refrigerant will settle in reservoirs 124a, 124b, and 146. The amount of liquid refrigerant contained in reservoirs 124a, 124b, and 146 may be monitored by liquid level sensors 160, and a signal indicative of the amount of refrigerant contained in reservoirs 124a, 124b, and 146 can be communicated to the respective controller 156a, 156b, and 158, respectively.

Separators 120a, 120b, and 144 will also collect refrigerant in the gaseous phase. A temperature/pressure of the gaseous refrigerant contained in separators 120a, 120b, and 144 may be monitored by pressure/temperate sensor 162, and signal(s) indicative of the pressure and temperature of the gaseous refrigerant can be communicated to the respective controller 156a, 156b, and 158, respectively.

The gaseous refrigerant contained in separators 120a, 120b, and 144 can be released from separators 120a, 120b, and 144 by operation of pressure regulation valves 128a, 128b, and 150. After exiting separators 120a, 120b, and 144, the gaseous refrigerant will subsequently be routed to suction line 44 for compression by compressor 40 before being directed to radiator 18, which condenses and cools the refrigerant. After exiting radiator 18, the now subcooled liquid refrigerant can then travel to each of the sub-loops 34, 36, and 38 by being drawn by pumps 104a, 104b, and 136, respectively.

According to the present disclosure, coolant system 28 is designed to control the amount of liquid refrigerant that is permitted to travel to sub-loops 34, 36, and 38 based on an amount of gaseous refrigerant that is released from separators 120a, 120b, and 144 by pressure regulation valves 128a, 128b, and 150. Put another way, the amount of liquid refrigerant that is permitted to travel back to sub-loops 34, 36, and 38 from radiator 18 is dictated by the amount of gaseous refrigerant that is released by pressure regulation valves 128a, 128b, and 150.

In an unmetered loop, by conservation of mass, the total amount of liquid refrigerant permitted to reenter the sub-loops 34, 36, and 38 from radiator 18 will be equal to the amount of gaseous refrigerant that is released by pressure regulation valves 128a, 128b, and 150 and returned to sub-loop 32 (cabin-refrigeration loop). It should be understood, however, that use of an unmetered loop would result in the sub-loops 34, 36, and 38 being full of only liquid refrigerant, which would not permit the sub-loops 34, 36, and 38 from benefitting from the refrigerant undergoing phase change to gas when cooling drive assemblies 94a, 94b, and battery 22. Accordingly, metering the amount of gaseous refrigerant that is permitted to exit separators 120a, 120b, and 144 by pressure regulation valves 128a, 128b, and 150 and metering the amount of liquid that can enter separators 120a, 120b, and 144 using mass flow metering devices 100a, 100b, and 134 can be used to slow the amount of liquid refrigerant flowing back to sub-loops 34, 36, and 38 from radiator 18 to more effectively utilize the refrigerant of cooling system 28 to cool drive assemblies 94a, 94b, and battery 22.

Controllers 156a, 156b, and 158, based on signals indicative of the amount of liquid contained in separators 120a, 120b, and 144 received from liquid level sensors 160, and signals indicative of pressure and temperature received from pressure/temperature sensors 162, may control pressure regulation valves 128a, 128b, and 150 and mass flow metering devices 100a, 100b, and 134 to dynamically control the amount of cooling provided to drive assemblies 94a, 94b, and battery 22, as needed.

While cooling of battery 22 is substantially similar to that of drive assemblies 94a, 94b, it should be understood that it is preferable that the pressure of the refrigerant at an inlet of pump 136 is controlled to be less in comparison to that of sub-loops 34 and 36 so that the temperature in sub-loop 38 having battery 22 will be low enough to allow for proper heat transfer away from battery 22.

Moreover, it should be understood that the pressure of the gaseous refrigerant exiting separators 120a, 120b, and 144 may be strictly controlled by pressure regulation valves 128a, 128b, and 150 to match a suction pressure located in suction line 44, which may be necessary for cabin heat exchanger 56 to operate properly (e.g., to permit sub-loop 32 to properly heat/cool a cabin 17 of the vehicle 10). Further, by matching the suction pressure in suction line 44, overall function of system 28 is ensured because proper directional flow of the refrigerant to the compressor 40 is maintained (i.e., the refrigerant will be unable to flow backwards in system 28) so that the gaseous refrigerant received from separators 120a, 120b, and 144 can be compressed by compressor 40 and then condensed by radiator 18.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A cooling system for an electric vehicle, comprising:
a cooling system loop including a refrigerant, a compressor, and a heat exchanger, the cooling system loop including a plurality of sub-loops configured to receive the refrigerant after the refrigerant exits the heat exchanger,
wherein at least one of the plurality of sub-loops comprises:
a mass flow metering device configured to receive the refrigerant in a liquid phase from the heat exchanger;
a separator configured to receive the refrigerant in the liquid phase after passing through the mass flow metering device;
a pump configured to draw the refrigerant in the liquid phase from the separator; and
a component located downstream from the pump that is configured to be cooled by the refrigerant in the liquid phase;
wherein after exchanging heat with the component to be cooled, the refrigerant in the liquid phase at least partially undergoes a phase change to gas and a mixture of the refrigerant in each of the gas and liquid phases is returned to the separator, and the separator includes a pressure regulation valve configured to release the refrigerant in the gas phase from the separator to travel back to a suction line of the compressor,
wherein an amount of refrigerant that is permitted to travel to the at least one sub-loop from the heat exchanger is based on an amount of the refrigerant in the gas phase that is released from the separator.

2. The cooling system according to claim 1, wherein the refrigerant in the liquid phase collected in the separator is provided back to the pump.

3. The cooling system according to claim 1, wherein the mass flow metering device is configured to control an amount of refrigerant in the liquid phase that enters the at least one sub-loop.

4. The cooling system according to claim 1, further comprising a controller in communication with at least the mass flow metering device and pressure regulation valve,
wherein the controller is configured to operate each of the mass flow metering device and pressure regulator valve to control an amount of the refrigerant in the gas phase that exits the separator and an amount of refrigerant in the liquid phase that passes through the mass flow metering device to control the amount of refrigerant that travels to the at least one sub-loop from the heat exchanger.

5. The cooling system according to claim 4, wherein the separator includes a plurality of sensors,
a first sensor of the plurality of sensors is configured to generate a signal indicative of an amount of the refrigerant in the liquid phase contained in the reservoir,
a second sensor is configured to generate a signal indicative of at least one of a temperature and pressure of the refrigerant contained in the reservoir, and based on the signals generated by the first sensor and the second sensor, the controller is configured to control the amount of the refrigerant in the gas phase that exits the separator and the amount of refrigerant that passes through the mass flow metering device in the liquid phase to control the amount of refrigerant that travels to the at least one sub-loop from the heat exchanger.

6. The cooling system according to claim 4, wherein the controller is configured to control the pressure regulator valve such that the refrigerant in the gas phase that exits the separator is at a pressure that matches a suction pressure of the suction line of the compressor.

7. The cooling system according to claim 1, wherein the component to be cooled is either a drive assembly of the electric vehicle that includes at least one of an electric drive motor and a power inverter device or a battery of the electric vehicle.

8. The cooling system according to claim 1, further comprising a second sub-loop and a third loop that are each configured to receive the refrigerant after the refrigerant exits the heat exchanger.

9. The cooling system according to claim 8, wherein the second sub-loop includes:
   a second mass flow metering device configured to receive the refrigerant in a liquid phase from the heat exchanger;
   a second separator configured to receive the refrigerant in the liquid phase after passing through the second mass flow metering device;
   a second pump configured to draw the refrigerant in the liquid phase from the second separator; and
   a second component located downstream from the second pump that is configured to be cooled by the refrigerant in the liquid phase;
   wherein after exchanging heat with the second component to be cooled, the refrigerant in the liquid phase at least partially undergoes a phase change to gas and a mixture of the refrigerant in each of the gas and liquid phases is returned to the second separator, and the second separator includes a second pressure regulation valve configured to release the refrigerant in the gas phase from the second separator to travel back to a suction line of the compressor,
   wherein an amount of refrigerant that is permitted to travel to second sub-loop from the heat exchanger is based on an amount of the refrigerant in the gas phase that is released from the second separator.

10. The cooling system according to claim 9, wherein the third sub-loop includes:
    a third mass flow metering device configured to receive the refrigerant in a liquid phase from the heat exchanger;
    a third separator configured to receive the refrigerant in the liquid phase after passing through the third mass flow metering device;
    a third pump configured to draw the refrigerant in the liquid phase from the third separator; and
    a third component located downstream from the third pump that is configured to be cooled by the refrigerant in the liquid phase;
    wherein after exchanging heat with the third component to be cooled, the refrigerant in the liquid phase at least partially undergoes a phase change to gas and a mixture of the refrigerant in each of the gas and liquid phases is returned to the third separator, and the third separator includes a third pressure regulation valve configured to release the refrigerant in the gas phase from the third separator to travel back to a suction line of the compressor,
    wherein an amount of refrigerant that is permitted to travel to the third sub-loop from the heat exchanger is based on an amount of the refrigerant in the gas phase that is released from the third separator.

11. The cooling system according to claim 10, wherein the second component to be cooled is a drive assembly of the electric vehicle that includes at least one of an electric drive motor and a power inverter device, and the third component to be cooled is a battery of the electric vehicle.

12. An electric vehicle, comprising:
    a vehicle body that defines a cabin;
    a drive assembly including an electric drive motor and a power inverter device;
    a battery for providing a current to the power inverter device that converts the current to one that can actuate the electric drive motor; and
    a cooling system loop including a refrigerant, a compressor, and a heat exchanger, the cooling system loop including a plurality of sub-loops configured to receive the refrigerant after the refrigerant exits the heat exchanger,
    wherein a first sub-loop of the plurality of sub-loops comprises includes a cabin heat exchanger in communication with each of the heat exchanger and compressor, the first sub-loop being configured to cool the cabin of the electric vehicle;
    wherein a second sub-loop of the plurality of sub-loops includes:
      a first mass flow metering device configured to receive the refrigerant from the heat exchanger;
      a first separator configured to receive the refrigerant from the first mass flow metering device;
      a first pump configured to draw the refrigerant from first separator; and
      the drive assembly, which is located downstream from the pump and configured to be cooled by the refrigerant;
      wherein after exchanging heat with the drive assembly, the refrigerant at least partially undergoes a phase change to gas and a mixture of the refrigerant in each of the gas and liquid phases is returned to the first separator, and the first separator includes a first pressure regulation valve configured to release the refrigerant in the gas phase from the first separator to travel back to a suction line of the compressor;
    a third sub-loop of the plurality of sub-loops includes:
      a second mass flow metering device configured to receive the refrigerant from the heat exchanger;
      a second separator configured to receive the refrigerant from the second mass flow metering device;
      a second pump configured to draw the refrigerant from second separator; and
      the battery, which is located downstream from the second pump and configured to be cooled by the refrigerant;
      wherein after exchanging heat with the battery, the refrigerant at least partially undergoes a phase change to gas and a mixture of the refrigerant in each of the gas and liquid phases is returned to the second separator, and the second separator includes a second pressure regulation valve configured to release the refrigerant in the gas phase from the second separator to travel back to a suction line of the compressor;

wherein an amount of refrigerant that is permitted to travel to the at least the second sub-loop and the third sub-loop from the heat exchanger is based on an amount of the refrigerant in the gas phase that is released from the first and second separators.

13. The electric vehicle according to claim 12, wherein the first and second mass flow metering devices are each configured to control an amount of refrigerant that enters the second sub-loop and the third sub-loop, respectively.

14. The electric vehicle according to claim 12, further comprising a controller in communication with at least the first and second mass flow metering devices and the first and second pressure regulation valves,
wherein the controller is configured to operate each of the first and second mass flow metering devices and first and second pressure regulator valves to control an amount of the refrigerant in the gas phase that exits the first and second separators and an amount of refrigerant that passes through the first and second mass flow metering devices to control the amount of refrigerant that travels to the second sub-loop and the third sub-loop, respectively, from the heat exchanger.

15. The electric vehicle according to claim 14, wherein each of the first and second separators include a plurality of sensors,
a first sensor of the plurality of sensors is configured to generate a signal indicative of an amount of the refrigerant in the liquid phase contained in the respective first and second separators,
a second sensor is configured to generate a signal indicative of at least one of a temperature and pressure of the refrigerant contained in the respective first and second separators, and
based on the signals generated by the first sensor and the second sensor, the controller is configured to control the amount of the refrigerant in the gas phase that exits the respective separator and the amount of refrigerant that passes through the respective mass flow metering device to control the amount of refrigerant that travels to the respective second sub-loop and third sub-loop from the heat exchanger.

16. The electric vehicle according to claim 14, wherein the controller is configured to control the first and second pressure regulator valves such that the refrigerant in the gas phase that exits the first and second separators is at a pressure that matches a suction pressure of the suction line of the compressor.

* * * * *